United States Patent
Myong

(10) Patent No.: US 8,176,653 B2
(45) Date of Patent: May 15, 2012

(54) METHOD FOR REMOVING MOISTURE FROM SUBSTRATE COATED WITH TRANSPARENT ELECTRODE

(75) Inventor: Seung-Yeop Myong, Seoul (KR)

(73) Assignee: Kisco (KR)

( * ) Notice: Subject to any disclaimer, the term of this patent is extended or adjusted under 35 U.S.C. 154(b) by 559 days.

(21) Appl. No.: 12/397,338

(22) Filed: Mar. 3, 2009

(65) Prior Publication Data

US 2009/0223079 A1    Sep. 10, 2009

(30) Foreign Application Priority Data

Mar. 4, 2008    (KR) .................. 10-2008-0020126

(51) Int. Cl.
| F26B 3/34 | (2006.01) |
| F26B 5/04 | (2006.01) |
| F26B 7/00 | (2006.01) |
| F26B 3/00 | (2006.01) |

(52) U.S. Cl. .............. 34/423; 34/274; 34/410; 34/412; 34/451

(58) Field of Classification Search ............ 34/245, 34/266, 268, 269, 273, 274, 282, 380, 381, 34/383, 402, 404, 406, 409, 410, 412, 417, 34/418, 419, 423, 427, 442, 443, 444, 445, 34/446, 447, 451, 493, 494, 497, 498, 500, 34/516, 523, 524, 526, 535, 540, 549, 562, 34/572, 573, 60, 68, 611, 236; 392/407, 392/411, 416, 417, 418, 432, 433, 435, 436, 392/437; 219/385, 386, 391, 392, 394, 395, 219/396, 402, 405, 409, 411, 443.1, 444.1, 219/476, 479, 538, 552, 553; 250/492.1, 250/492.2, 493.1, 494.1, 495.1
See application file for complete search history.

(56) References Cited

U.S. PATENT DOCUMENTS

| 5,629,920 | A | 5/1997 | Sakano et al. |
| 2003/0020397 | A1* | 1/2003 | Beatty ........................... 313/503 |
| 2004/0031957 | A1* | 2/2004 | Tyan ............................... 257/40 |

FOREIGN PATENT DOCUMENTS

| EP | 1840990 | 10/2007 |
| EP | 1870948 | 12/2007 |
| EP | 1870948 A2 * | 12/2007 |
| JP | 2004111485 | 4/2004 |
| JP | 2005190822 | 7/2005 |
| KR | 1020020086507 A | 11/2002 |
| KR | 1020050097051 A | 10/2005 |

* cited by examiner

*Primary Examiner* — Philip Tucker
*Assistant Examiner* — Brian R Slawski
(74) *Attorney, Agent, or Firm* — The Belles Group, P.C.

(57) ABSTRACT

A method for removing moisture from a substrate coated with a transparent electrode comprises the steps of placing the substrate coated with the transparent electrode in an infrared oven, applying heat to the substrate in the infrared oven, drawing the substrate from the infrared oven, loading the substrate in a chamber and reducing pressure in the chamber and performing a heat treatment on the substrate.

21 Claims, 4 Drawing Sheets

METHOD FOR REMOVING MOISTURE FROM SUBSTRATE COATED WITH TRANSPARENT ELECTRODE

This application claims the benefit of Korean Patent Application No. 10-2008-0020126 filed on Mar. 4, 2008, which is hereby incorporated by reference.

BACKGROUND

1. Field

The embodiment relates to a method for removing moisture from a substrate coated with a transparent electrode.

2. Description of the Related Art

A transparent electrode has been used to manufacture a device such as a thin film solar cell, a thin film transistor liquid crystal display (TFT LCD), an organic electro luminescence display (OELD), a light emitting diode (LED), or a laser diode (LD).

The transparent electrode is coated on a substrate, and is patterned according to a need of each procedure in a process for manufacturing the listed devices. An etching procedure is used at the patterning time. In this case, etch residues pollute the transparent electrode or a substrate. The pollution significantly deteriorates characteristics of a device. Accordingly, a procedure for washing the transparent electrode and the substrate is performed after the etching procedure. A wet cleaning process using deionized water is widely used as the cleaning procedure.

Among the listed devices, for example, in a mass production line of the thin film solar cell, before a silicon thin film is deposited on a glass substrate coated with a transparent electrode, a wet cleaning process using deionized water is necessarily performed so as to remove particles being etch residues remaining on a surface of the transparent electrode or the substrate.

In the case, a transparent electrode coated by chemical vapor deposition (CVD) is a polycrystalline thin film having a structure in which moisture is readily adsorbed on a surface thereof and at an intercrystalline particle boundary. Accordingly, the deionized water used in the wet cleaning process is adsorbed on the surface of the transparent electrode and at the intercrystalline particle boundary.

If moisture such as deionized water remains on the transparent electrode or the substrate, upon deposition of a thin film on the transparent electrode or the substrate for forming the thin film device, adhesion between thin films is deteriorated. Due to this, a thin film deposited on the transparent electrode or the substrate is frequently peeled off therefrom. Such a feature is connected directly with characteristics and yield of the listed devices.

Among the listed devices, for example, in a case of the thin film solar cell, moisture remaining on the transparent electrode is diffused into a silicon layer of a thin film coated on the transparent electrode to reduce an open-circuit voltage, which becomes the cause of deterioration in photo-electronic conversion efficiency of the thin film solar cell. Consequently, it is very important to remove the moisture remaining on the transparent electrode or the substrate in order to manufacture the thin film solar cell with high efficiency and high yield.

For example, in a case of the OELD, an organic layer forming an emission layer may be degraded due to moisture remaining on the transparent electrode or the substrate. This reduces the life of OELD and deteriorates emission efficiency thereof.

Consequently, in a thin film device using the transparent electrode, a method for removing moisture remaining on the transparent electrode or the substrate is very important to improve characteristics of the thin film device.

SUMMARY

In one aspect, a method for removing moisture from a substrate coated with a transparent electrode comprises the steps of placing the substrate coated with the transparent electrode in an infrared oven, applying heat to the substrate in the infrared oven, drawing the substrate from the infrared oven, loading the substrate in a chamber and reducing pressure in the chamber and performing a heat treatment on the substrate.

A temperature in the infrared oven may range from 120° C. to 200° C.

A temperature in the infrared oven may range from 150° C. to 200° C.

The pressure in the chamber may be reduced to a range from $10^{-7}$ to $10^{-3}$ Torr.

A temperature in the chamber may range from 150° C. to 200° C.

It may take a time from 60 seconds to 180 seconds to perform a step of placing the substrate coated with the transparent electrode in an infrared oven, a step of applying heat to the substrate in the infrared oven, and a step of drawing the substrate from the infrared oven.

It may take a time from 60 seconds to 180 seconds to perform the heat treatment in the chamber.

The transparent electrode may comprise one of zinc oxide (ZnO), tin oxide ($SnO_2$), indium zinc oxide (IZO), and indium tin oxide (ITO).

The transparent electrode may be scribed by laser.

The substrate may be conveyed in the infrared oven by a conveyor.

The conveyor may be made by heat resistant materials.

In other aspect, a method for removing moisture from a substrate coated with a transparent electrode comprises the steps of placing the substrate coated with the transparent electrode in an infrared oven, applying heat to the substrate in the infrared oven, drawing the substrate from the infrared oven, loading the substrate in a chamber, introducing reaction gas in the chamber, fixing pressure in the chamber and performing a heat treatment on the substrate in the chamber with the reaction gas.

A temperature in the infrared oven may range from 150° C. to 200° C.

The method may further comprise reducing the pressure in the chamber after performing the heat treatment on the substrate with the reaction gas.

The pressure in the chamber in which the substrate may be loaded ranges from $10^{-7}$ to $10^{-3}$ Torr.

The pressure in the chamber may be reduced to a range from $10^{-7}$ to $10^{-3}$ Torr.

The reaction gas may be introduced into the chamber at a flow rate from 10 to 500 sccm.

The pressure in the chamber may be fixed to a range from 0.3 to 5 Torr.

A temperature in the chamber may range from 150° C. to 200° C. in the step of performing the heat treatment with the reaction gas.

The reaction gas may comprise one selected from the group consisting of nitrogen ($N_2$), argon (Ar), and hydrogen ($H_2$).

It takes a time from 60 seconds to 180 seconds to perform a step of placing the substrate coated with the transparent electrode in an infrared oven, a step of applying heat to the substrate in the infrared oven, and a step of drawing the substrate from the infrared oven.

It may take a time from 60 seconds to 180 seconds to perform the heat treatment with the reaction gas.

The substrate may be conveyed in the infrared oven by a conveyor.

The conveyor may be made by heat resistant materials.

BRIEF DESCRIPTION OF THE DRAWINGS

The accompany drawings, which are included to provide a further understanding of embodiments and are incorporated on and constitute a part of this specification, illustrate the embodiments and together with the description serve to explain the principles of the embodiments. In the drawings.

DETAILED DESCRIPTION OF EMBODIMENTS

Figure 1A:
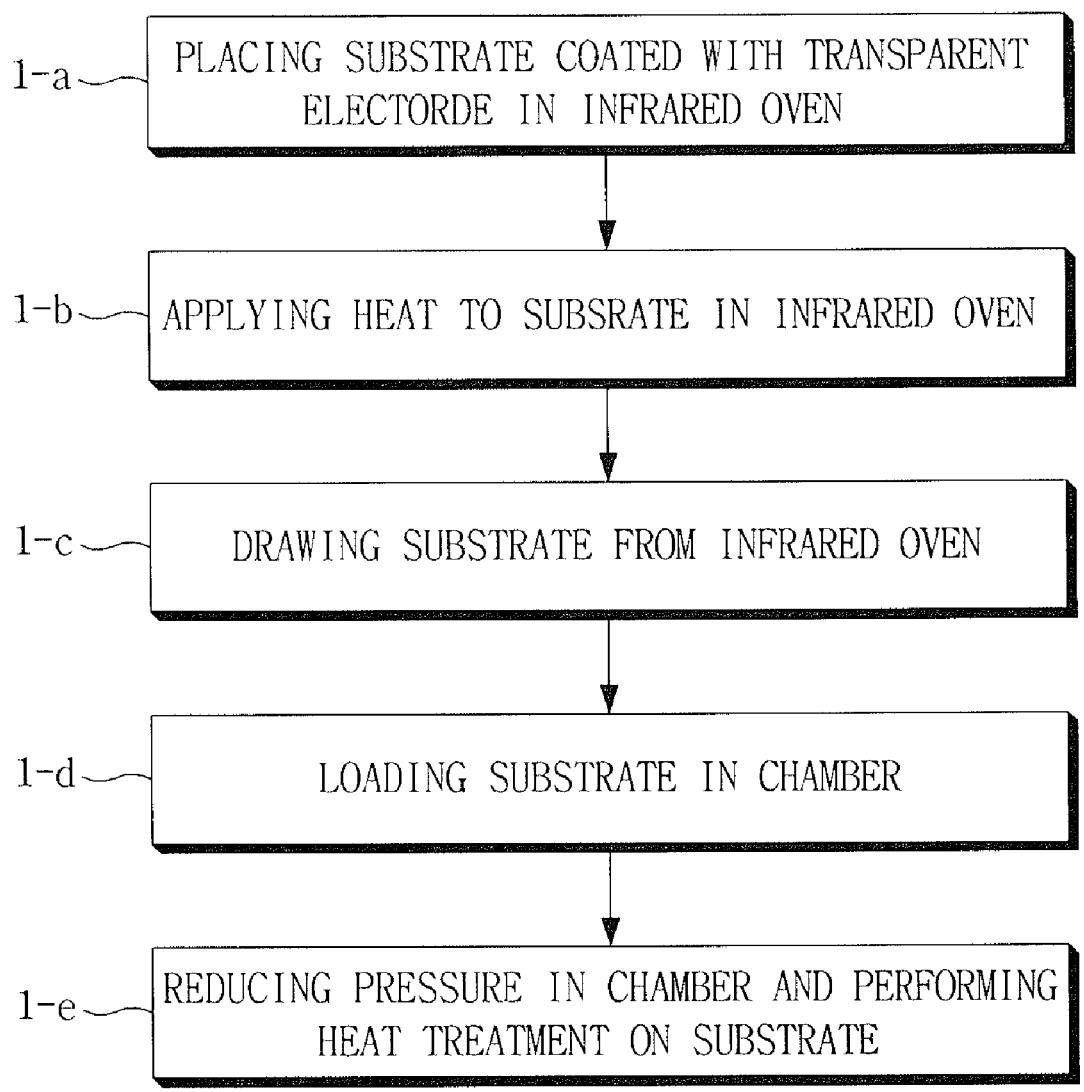
FIGS. 1a and 1b are views illustrating a method for removing moisture from a substrate coated with a transparent electrode in accordance with a first embodiment.

Reference will now be made in detail embodiments of which are illustrated in the accompanying drawings.

[First Embodiment]

In a case of a thin film solar cell, light is primarily incident on a substrate 112. The substrate 112 has excellent light transmission. The substrate 112 may comprise a transparent insulation material, which prevents the occurrence of short-circuit in the thin film solar cell.

In a case of a device with a transparent electrode 111 such as the TFT LCD, the OELD, or the LED, light from an inside of the devices is emitted to an outside through the substrate 112. The substrate 112 has excellent light transmission. The substrate 112 comprises a transparent insulation material, which may prevent the occurrence of short-circuit in the device. For example, the substrate 112 may comprise any one selected from soda lime glass, general glass, and tempered glass. Polymer material may be used as the material of the substrate 112. In addition, a silicon substrate or a sapphire substrate may be used as the substrate 112. The embodiment is not limited to the listed materials.

In case of the thin film solar cell, the transparent electrode 111 may comprise transparent conductive materials so that solar light transmitted through the substrate 112 may be incident on a photo-electronic conversion layer (not shown). Meanwhile, in a case of a device such as the TFT LCD, the OELD, or the LED, the transparent electrode 111 may also comprise transparent conductive materials so that light from an inside of the device may be emitted to an outside through the substrate 112.

For example, the transparent electrode 111 may comprise at least one of zinc oxide (ZnO), tin oxide ($SnO_2$), indium zinc oxide (IZO), and indium tin oxide (ITO), and the transparent electrode 111 is formed on a substrate 112 by a chemical vapor deposition (CVD) process or a sputter process.

Further, the transparent electrode 111 may be coated on the substrate 112 by a printing process using a sol-gel solution containing zinc oxide (ZnO), tin oxide ($SnO_2$), indium zinc oxide (IZO), or indium tin oxide (ITO) as ink. However, the process for coating the transparent electrode 111 on the substrate 112 is not limited to the foregoing listed method.

As illustrated above, the transparent electrode 111 is coated on the substrate 112.

The transparent electrode 111 used for a device for a liquid crystal display (LCD), an organic electro luminescence display (OELD), a light emitting diode (LED) is patterned according to a need of each device. There is a laser scribing method, a photolithographic method, or the like as an example of an etching method for patterning the transparent electrode 111.

Upon patterning of the transparent electrode 111 through etching, etching residues occur. The etching residues pollute a surface of the substrate 112 or the transparent electrode 111. Accordingly, so as to remove the etching residues, the transparent electrode 111 and the substrate 112 are cleaned using deionized water in a deionized water cleaner 102.

After cleaning of the transparent electrode 111 and the substrate 112, in order to remove moisture remaining on the transparent electrode 111 and the substrate 112, an air knife (not shown) mounted in the deionized water cleaner 102 is used. That is, the air knife injects gas to a surface of the transparent electrode 111 and the substrate 112. The injected gas removes deionized water remaining on the surface of the transparent electrode 111 and the surface of the substrate 112 to dry the transparent electrode 111 and the substrate 112. The air knife may be a drilled pipe type air knife, a flat air nozzle type air knife, or a blower air type air knife. Further, another type of air knife can be used. Other gases as well as air or nitrogen may be used as the gas injected from the air knife.

Subsequently, the substrate 112 coated with the transparent electrode 111 is drawn from an inside of the deionized water cleaner 102. The drawn substrate 112 is conveyed through a conveyor 103. The conveyor 103 connects the deionized water cleaner 102, an infrared oven 101, and a chamber 100 in-line.

Figure 1B:
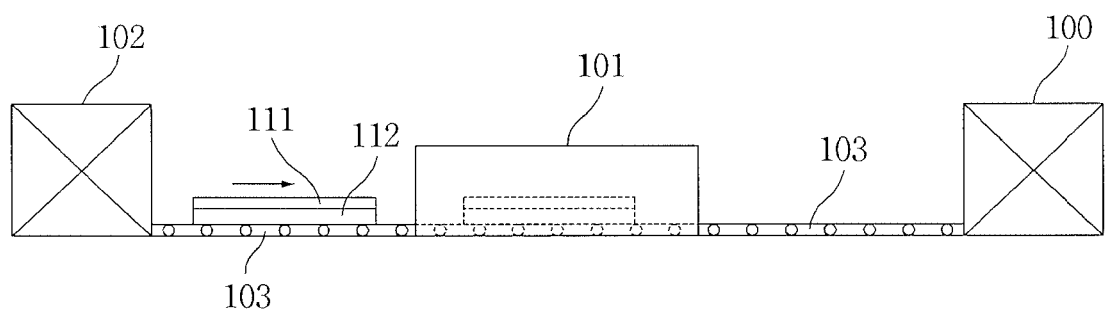

As shown in FIGS. 1a and 1b, the drawn substrate 112 from the deionized water cleaner 102 is introduced in the infrared oven 101 through the conveyor 103 (step 1-a).

Referring to FIGS. 1a and 1b, heat is applied to the substrate 112 coated with the transparent electrode 111 in the infrared oven 101 (step 1-b).

While the substrate 112 coated with the transparent electrode 111 is moving through the conveyor 103 mounted in the infrared oven 101, the infrared oven 101 applies heat to the substrate coated with the transparent electrode 111. At this time, moisture remaining on the substrate 112 coated with the transparent electrode 111 vaporizes due to a heat energy supplied from the infrared oven 101. Accordingly, remaining moisture is removed from the substrate 112 coated with the transparent electrode 111 by the air knife mounted in the deionized water cleaner 102.

In this case, a temperature in the infrared oven 101 in which moisture removal is performed, may be equal to or higher than 100° C., which may vaporize the moisture under atmospheric pressure. Accordingly, so as to stably remove the moisture, the temperature in the infrared oven 101 may range from 100° C. to 120° C. The temperature in the infrared oven 101 may range from 150° C. to 200° C. for easy vaporization of the moisture.

If the temperature in the infrared oven 101 is equal to or higher than 150° C., moisture remaining at a particle boundary of a polycrystalline transparent electrode 111 as well as moisture remaining on a surface of the transparent electrode 111 or the substrate 112 may vaporize. Meanwhile, if the temperature in the infrared oven 101 is lower than or equal to 200° C., not only the moisture remaining on a surface of the transparent electrode 111 or the substrate 112 and the moisture remaining at the particle boundary vaporizes but also characteristics of the transparent electrode 111 is maintained.

The substrate 112 moves in the infrared oven 101 through the conveyor 103. Without additional devices for moving the substrate 112 either from the conveyor 103 to the infrared oven 101 or from the infrared oven 101 to the conveyor 103, the substrate 112 moves to the infrared oven 101 or is moved from the infrared oven 101. In this case, the conveyor 103 can be made by heat-resistant materials.

As illustrated in FIGS. 1a and 1b, the substrate 112 coated with the transparent electrode 111 is drawn from the infrared oven 101 (step 1-c).

In the meantime, a tact time required of the substrate 112 coated with the transparent electrode 111 passing through the infrared oven 101 may be 60 seconds to 180 seconds.

If the required tact time of the substrate 112 coated with the transparent electrode 111 is equal to or greater than 60 seconds, the moisture remaining on the substrate 112 coated with the transparent electrode 111 may be sufficiently removed. If the required tact time of the substrate 112 coated with the transparent electrode 111 is less than or equal to 180 seconds, the tact time of the substrate 112 passing through the infrared oven 101 is prevented from increasing unnecessarily, thereby preventing the deterioration in throughput.

As shown in FIGS. 1a and 1b, the substrate 112 having passed through the infrared oven 101 is loaded in a chamber 100 through the conveyor 103 (step 1-d). The conveyor 103 conveying the substrate 112 from the infrared oven 101 to the chamber 100 may be made by heat-resistant materials or the conveyor 103 may be a general conveyor.

As illustrated in FIGS. 1a and 1b, pressure in the chamber 100 is reduced and a heat treatment is performed on the substrate 112 coated with the transparent electrode 111 (step 1-e).

Figure 1C:
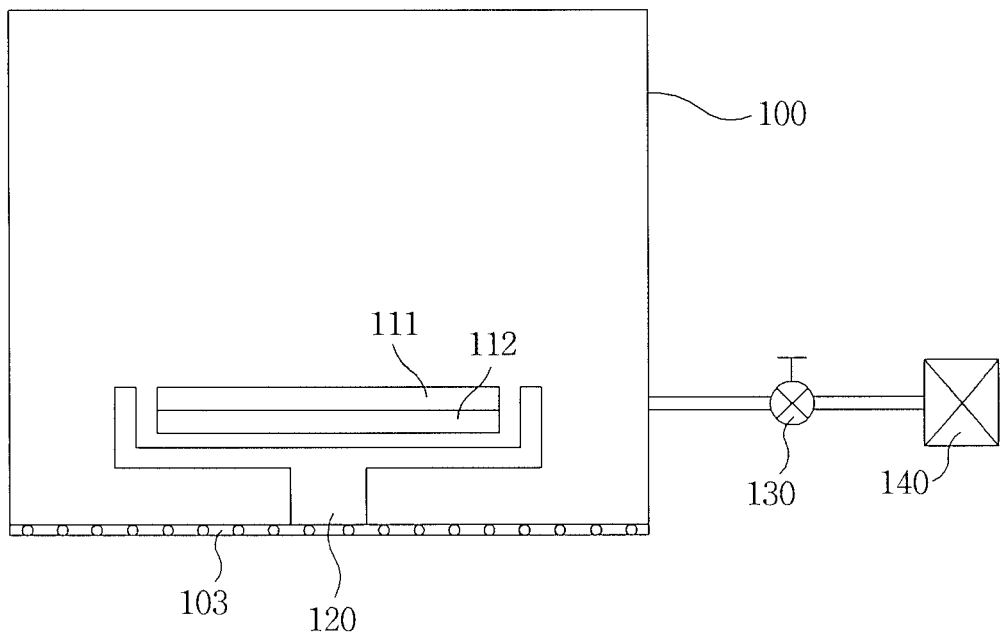
FIG. 1c is a view illustrating a chamber in which a heat treatment is performed in a process for removing moisture from a substrate coated with a transparent electrode in accordance with the first embodiment.

As shown in FIG. 1c, a vacuum pump 140 reduces the pressure of the chamber 100 in which the substrate 112 coated with the transparent electrode 111 is loaded. The reduced pressure in the chamber 100 may be in a range of $10^{-7}$ to $10^{-3}$ Torr. If the pressure in the chamber 100 is equal to or greater than $10^{-7}$, the moisture remaining on the substrate 10 may be discharged to an outside of the chamber 100 in the course of pressure reduction to be further removed. If the pressure in the chamber 100 is lower than or equal to $10^{-3}$, an excessive increase in a pressure reduction time may be prevented. In order to reduce the pressure reduction time, an angle valve 130 connected between the chamber 100 and the vacuum pump 140 may be completely open.

At this time, the chamber 100 maintains a temperature range from 150° C. to 200° C. Under the vacuum atmosphere, heat treatment is performed on the substrate 112 coated with the transparent electrode 111. If the temperature in the chamber 100 is equal to or greater than 150° C., the moisture on the substrate 112 is sufficiently removed. If the temperature in the chamber 100 is lower than or equal to 200° C., the deterioration in characteristics of the transparent electrode 111 may be prevented. As described earlier, because the pressure in the chamber 100 in which the substrate 112 is loaded is reduced and the heat treatment is performed, the moisture remaining on the substrate 112 coated with the transparent electrode 111 is additionally removed.

Meanwhile, a tact time required to perform the heat treatment in the chamber 100 may range from 60 seconds to 180 seconds. If a heat treatment time is equal to or greater than 60 seconds, the moisture remaining on the substrate 112 coated with the transparent electrode 111 may be sufficiently removed. If the heat treatment time is less than or equal to 180 seconds, it may prevent an unnecessary increase in the tact time required to perform the heat treatment, thereby preventing the deterioration in throughput.

In FIG. 1c, reference numeral 120 refers to a substrate support on which the substrate is positioned.

Through the heat treatment of the infrared oven 101 and the chamber 100, the moisture remaining on the substrate 112 is substantially completely removed. A process for depositing a thin film on the substrate 112 coated with the transparent electrode 111 is effected through designated processes.

A method for removing moisture from the substrate 112 coated with the transparent electrode 111 in accordance with the first embodiment may be used to manufacture thin film solar cells, thin film transistor liquid crystal displays, organic electro luminescence devices, light emitting diodes, or laser diodes. However, the first embodiment is not limited to a method for manufacturing the listed devices. The first embodiment may be used in a method for manufacturing devices other than the listed devices.

[Second Embodiment]

Figure 2A:
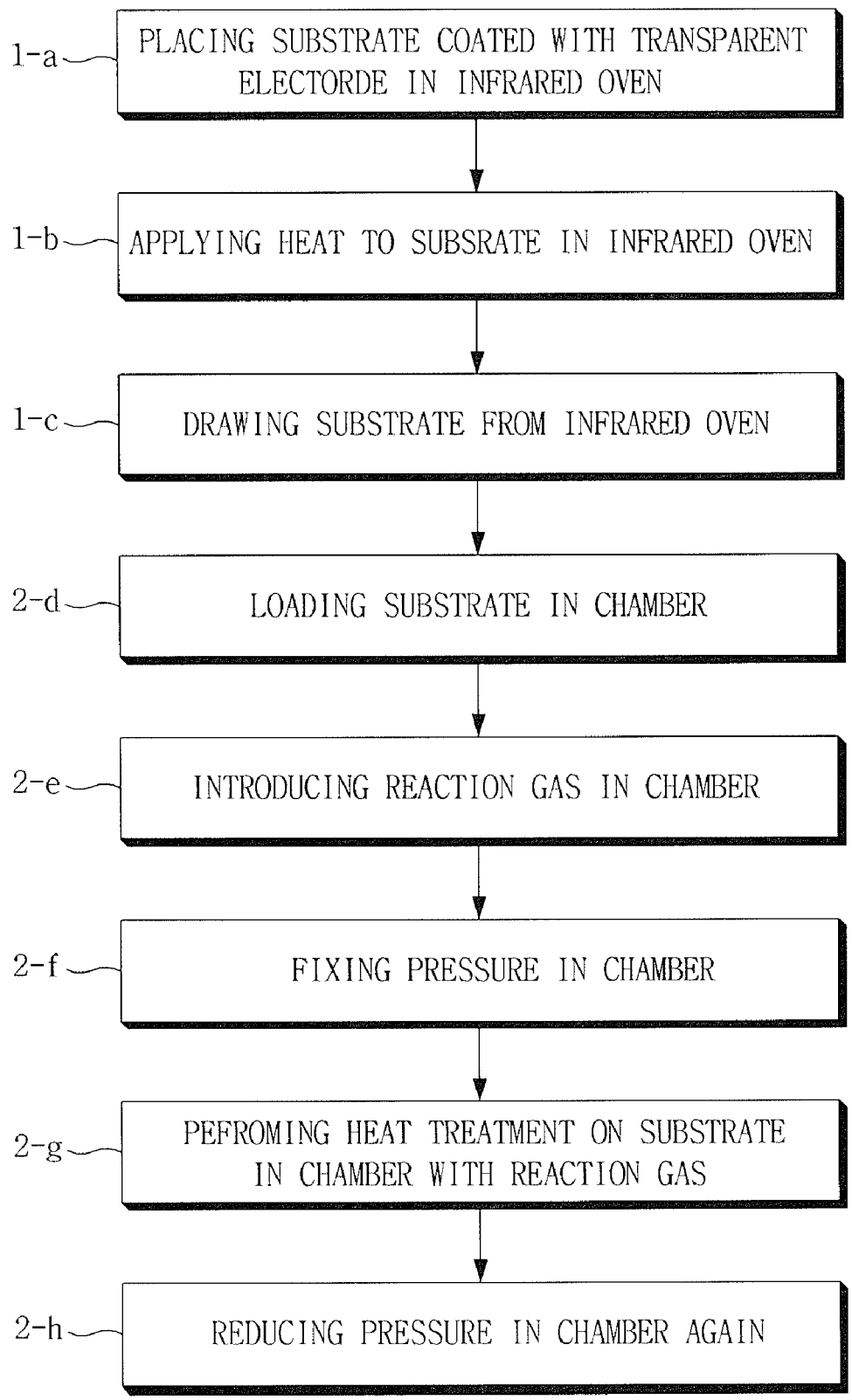
FIG. 2a is a view illustrating a method for removing moisture from a substrate coated with a transparent electrode in accordance with a second embodiment.

As shown in FIGS. 1a and 2a, since a step 1-a of placing a substrate 112 coated with a transparent electrode 111 in an infrared oven 101, a step 1-b of applying heat to the substrate 112 coated with the transparent electrode 111 in the infrared oven 101, and a step 1-c of drawing the substrate 112 from the infrared oven 101 are effected in substantially the same manner as that of the first embodiment, a detailed description thereof is omitted.

Figure 2B:
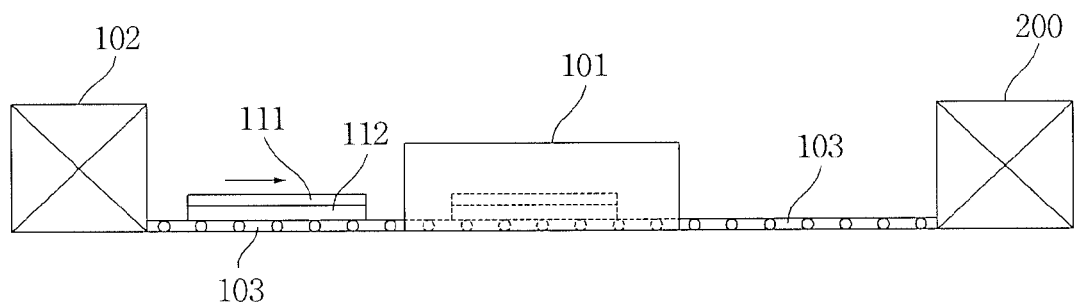
FIG. 2b is a view illustrating a process for removing moisture from a substrate coated with a transparent electrode in accordance with the second embodiment.
Figure 2C:
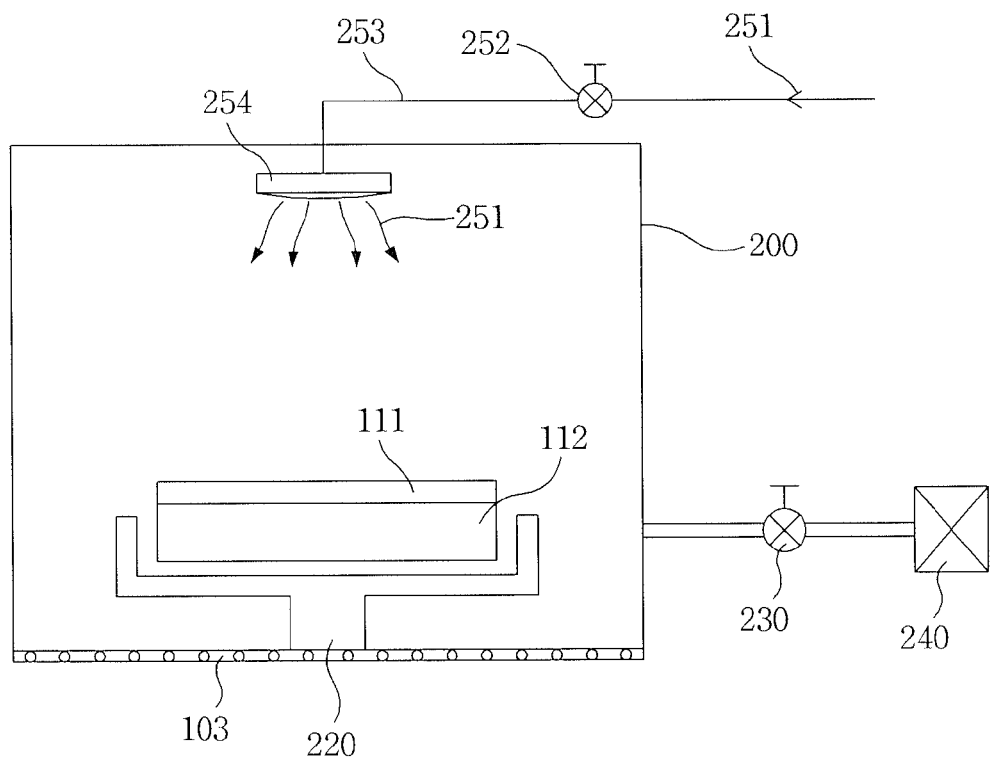
FIG. 2c is a view illustrating a chamber in which a heat treatment is performed in a process for removing moisture from a substrate coated with a transparent electrode in accordance with the second embodiment.

As illustrate in FIGS. 2a to 2c, the substrate 112 coated with the transparent electrode 111 is loaded in a chamber 200 (step 2-d).

After loading the substrate 112 in the chamber 200, an angle valve 230 connected between the chamber 200 and a vacuum pump 240 is operated to adjust pressure of the chamber 200 in the range from $10^{-7}$ to $10^{-3}$ Torr. The reason why the pressure of the chamber 200 is adjusted in the range from $10^{-7}$ to $10^{-3}$ Torr was explained in the first embodiment, and a detailed description thereof is omitted.

With reference to FIGS. 2a and 2c, reaction gas 251 is introduced in the chamber 200 (step 2-e). The reaction gas 251 is supplied into the chamber 200 through a reaction gas supply line 253 connected to the chamber 200. The supplied reaction gas 251 is introduced in the chamber 200 through a reaction gas supply nozzle 254 mounted in the chamber 200. A control valve 252 is mounted in the reaction gas supply line 253 and controls a flow rate of the reaction gas 251 to be supplied into the chamber 200.

The flow rate of the reaction gas to be supplied to the chamber 200 through the control valve 252 may be in the range from 10 standard cubic centimeters per minute (sccm) to 500 sccm. Accordingly, a flow rate of the reaction gas 251 to be introduced in the chamber 200 is in the range of 10 sccm to 500 sccm. The reaction gas introduced in the chamber 200 may remove moisture remaining on the substrate 112 coated with the transparent electrode 111 in a subsequent heat treatment step.

If the flow rate of the reaction gas 251 introduced into the chamber 200 is equal to or more than 10 sccm, the reaction gas 251 may efficiently remove the moisture remaining on the substrate 112 coated with the transparent electrode 111. Meanwhile, if the flow rate of the reaction gas 251 introduced into the chamber 200 is less than or equal to 500 sccm, it consumes less of the reaction gas 251, thereby preventing an increase in manufacturing costs.

The reaction gas 251 may be one selected from the group consisting of nitrogen ($N_2$), argon (Ar), and hydrogen ($H_2$). However, the second embodiment is not limited thereto.

The pressure in the chamber 200 is fixed (step 2-f). Although the pressure in the chamber 200 is adjusted to the range of $10^{-7}$ to $10^{-3}$ Torr in step 2-d, because the reaction gas 251 is introduced in the chamber 200, the pressure in the chamber 200 is increased. If the pressure in the chamber 200 is not fixed within a predetermined range, the collision possibility between molecules of the reaction gas introduced in the chamber 200 is increased.

Accordingly, through a heat treatment using reaction gas, there may arise that the moisture remaining on the substrate 112 coated with the transparent electrode 111 may not be efficiently removed. Consequently, the pressure in the chamber 200 may be fixed within a limited range.

In this case, the pressure in the chamber 200 is fixed within a limited range by a pressure controller (not shown). The pressure controller controls a control valve 252 and an angle valve 230 to fix the pressure in the chamber 200 within the limited range. The control valve 252 controls a flow rate of the reaction gas 251 to be supplied into the chamber 200. The angle valve 230 is connected between the chamber 200 and a vacuum pump 240.

The pressure in the chamber 200 may be fixed in a range from 0.3 to 5 Torr by the pressure controller. If the pressure in the chamber 200 is less than 0.3 Torr, the pressure controller maintains the angle valve 230 constant and increases the flow rate of the reaction gas to be supplied to the chamber 200 through the control valve 252, or maintains the control valve 252 constant and controls the angle valve 230, thereby reducing an amount of the reaction gas 251 to be discharged from the chamber 200 by the vacuum pump 240.

If the pressure in the chamber 200 exceeds 5 Torr, the pressure controller may control the angle valve 230 to increase an amount of gas discharged from the chamber 200 and to maintain the control valve 252 constant, or control the control valve 252 to reduce an amount of the gas introduced into the chamber 200 and to maintain the angle valve 230 constant.

As illustrated in FIGS. 2a and 2c, a heat treatment is effected on the substrate 112 coated with the transparent electrode 111 with reaction gas in the chamber 200 (step 2-g).

When hydrogen ($H_2$) is used as the reaction gas 251, the following is a procedure of removing the moisture remaining on the substrate 112 coated with the transparent electrode 111 with hydrogen gas.

A diffusion speed of the hydrogen gas is significantly high. Accordingly, although the transparent electrode 111 and the substrate 112 are exposed at a predetermined temperature for a predetermined time, the hydrogen reaches a surface to several μm depth of the transparent electrode 111 and the substrate 112. Activated hydrogen ($H_2$) in the chamber 200 by heat is diffused in the chamber 200 through the surface and a particle boundary of the transparent electrode 111 and the substrate 112. The hydrogen ($H_2$) diffused in the transparent electrode 111 and the substrate 112 moves from the transparent electrode 111 and the substrate 112 to collide with moisture ($H_2O$) contained in the transparent electrode 111 and the substrate 112. Accordingly, the moisture ($H_2O$) contained in the transparent electrode 111 and the substrate 112 is peeled or heat is transferred to the moisture ($H_2O$) to spontaneously peel the moisture ($H_2O$) from the transparent electrode 111.

Further, reaction gas such as nitrogen ($N_2$) or argon (Ar) removes the moisture remaining on the substrate 112 coated with the transparent electrode 111 in the same manner as in a case of the hydrogen ($H_2$).

Upon performing a heat treatment with the reaction gas 251, the temperature in the chamber 200 may be in the range from 150° C. to 200° C. If the temperature in the chamber 200 is equal to or greater than 150° C., the moisture ($H_2O$) remaining on the substrate 112 coated with the transparent electrode 111 may be efficiently removed within a relatively short time by the reaction gas 251.

If the temperature in the chamber 200 is less than or equal to 200° C., it may prevent the deterioration in optical and electrical characteristics of zinc oxide (ZnO) or indium zinc oxide (IZO) forming the transparent electrode 111. For example, the transparent electrode 111 comprise the zinc oxide (ZnO), so as to improve electrical characteristics of the zinc oxide (ZnO), boron (B) used as dopant becomes discolored to yellow to deteriorate light transmittance in a visible light region.

In a case of a thin film solar cell, the discoloration of the boron may change a wavelength range of solar light incident to a photo-electronic conversion layer to deteriorate efficiency of the thin film solar cell. Further, in a case of a display device, light emitted therefrom may be distorted. Consequently, if the temperature in the chamber 200 is less than or equal to 200° C., the moisture remaining on the substrate 112 coated with the transparent electrode 111 is removed to maintain the optical and electrical characteristics of the transparent electrode 111.

In the meantime, a tact time required to perform the heat treatment in the chamber 200 may be in the range from 60 seconds to 180 seconds. If a time required to perform the heat treatment is equal to or longer than 60 seconds, the moisture remaining on the substrate 112 coated with the transparent electrode 111 may be sufficiently removed. If the time required to perform the heat treatment is less than or equal to 180 seconds, an unnecessary increase in the tact time required to perform the heat treatment is prevented.

Meanwhile, so as to maximize effect for removing the moisture remaining on the substrate 112 coated with the transparent electrode 111, a step 2-h may be further carried out. After step 2-g, the pressure in the chamber may be again reduced once (step 2-h). The angle valve is completely opened and the pressure in the chamber is adjusted to a range from $10^{-7}$ to $10^{-3}$ Torr by the vacuum pump 240. This may perfectly remove the moisture remaining in the chamber 200. Next, for a subsequent process, the substrate 112 is drawn from the chamber 200.

Because a description of the conveyor 103 shown in FIG. 2b was given above in the first embodiment, it is omitted.

The foregoing series of procedures completely removes the moisture remaining on a substrate 112 coated with the transparent electrode 111 occurring due to a cleaning process after an etch process for patterning the transparent electrode. After the removal of the moisture, a process for depositing a thin film on the substrate 112 coated with the transparent electrode 111 is effected by designated processes.

A method for removing moisture from the substrate 112 coated with the transparent electrode 111 in accordance with an embodiment of the present invention may be used to manufacture thin film solar cells, thin film transistor liquid crystal displays, organic electro luminescence devices, light emitting diodes, or laser diodes. However, the present invention is not limited to a method for manufacturing the listed devices. The present invention may be used in a method for manufacturing devices other than the listed devices.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art.

What is claimed is:

1. A method for removing moisture from a substrate coated with a transparent electrode comprising the steps of:
    placing the substrate coated with the transparent electrode in an infrared oven;
    applying heat to the substrate in the infrared oven;
    drawing the substrate from the infrared oven;
    loading the substrate in a chamber; and
    reducing pressure in the chamber and performing a heat treatment on the substrate;
    wherein it takes a time from 60 seconds to 180 seconds to perform a step of placing the substrate coated with the transparent electrode in an infrared oven; a step of applying heat to the substrate in the infrared oven; and a step of drawing the substrate from the infrared oven, and
    wherein it takes a time from 60 seconds to 180 seconds to perform the heat treatment in the chamber.

2. The method according to claim 1, wherein a temperature in the infrared oven ranges from 120° C. to 200° C.

3. The method according to claim 1, wherein a temperature in the infrared oven ranges from 150° C. to 200° C.

4. The method according to claim 1, wherein the pressure in the chamber is reduced to a range from $10^{-7}$ to $10^{-3}$ Torr.

5. The method according to claim 1, wherein a temperature in the chamber ranges from 150° C. to 200° C.

6. The method according to claim 1, wherein the transparent electrode comprises one of zinc oxide (ZnO), tin oxide ($SnO_2$), indium zinc oxide (IZO), and indium tin oxide (ITO).

7. The method according to claim 1, wherein the transparent electrode is scribed by laser.

8. The method according to claim 1, wherein the substrate is conveyed in the infrared oven by a conveyor.

9. The method according to claim 8, wherein the conveyor is made by heat resistant materials.

10. A method for removing moisture from a substrate coated with a transparent electrode comprising the steps of:
    placing the substrate coated with the transparent electrode in an infrared oven;
    applying heat to the substrate in the infrared oven;
    drawing the substrate from the infrared oven;
    loading the substrate in a chamber;
    introducing reaction gas in the chamber;
    fixing pressure in the chamber; and
    performing a heat treatment on the substrate in the chamber with the reaction gas,
    wherein it takes a time from 60 seconds to 180 seconds to perform a step of placing the substrate coated with the transparent electrode in an infrared oven; a step of applying heat to the substrate in the infrared oven; and a step of drawing the substrate from the infrared oven, and
    wherein it takes a time from 60 seconds to 180 seconds to perform the heat treatment with the reaction gas.

11. The method according to claim 10, wherein a temperature in the infrared oven ranges from 150° C. to 200° C.

12. The method according to claim 10, further comprising reducing the pressure in the chamber after performing the heat treatment on the substrate with the reaction gas.

13. The method according to claim 10, wherein the pressure in the chamber in which the substrate is loaded ranges from $10^{-7}$ to $10^{-3}$ Torr.

14. The method according to claim 12, wherein the pressure in the chamber is reduced to a range from $10^{-7}$ to $10^{-3}$ Torr.

15. The method according to claim 10, wherein the reaction gas is introduced into the chamber at a flow rate from 10 to 500 sccm.

16. The method according to claim 10, wherein the pressure in the chamber is fixed to a range from 0.3 to 5 Torr.

17. The method according to claim 10, wherein a temperature in the chamber ranges from 150° C. to 200° C. in the step of performing the heat treatment with the reaction gas.

18. The method according to claim 10, wherein the reaction gas comprises one selected from the group consisting of nitrogen ($N_2$), argon (Ar), and hydrogen ($H_2$).

19. The method according to claim 10, wherein the substrate is conveyed in the infrared oven by a conveyor.

20. The method according to claim 19, wherein the conveyor is made by heat resistant materials.

21. A method for removing moisture from a substrate coated with a transparent electrode for a solar cell, after the substrate with the transparent electrode has been subjected to a wet cleaning process, comprising the steps of:
    placing the substrate coated with the transparent electrode in an infrared oven;
    applying heat to the substrate in the infrared oven;
    drawing the substrate from the infrared oven;
    loading the substrate in a chamber; and
    reducing pressure in the chamber and performing a heat treatment on the substrate;
    wherein it takes a time from 60 seconds to 180 seconds to perform a step of placing the substrate coated with the transparent electrode in an infrared oven; a step of applying heat to the substrate in the infrared oven; and a step of drawing the substrate from the infrared oven, and
    wherein it takes a time from 60 seconds to 180 seconds to perform the heat treatment in the chamber.

* * * * *